US008940564B1

(12) United States Patent
Kim et al.

(10) Patent No.: US 8,940,564 B1
(45) Date of Patent: Jan. 27, 2015

(54) METHOD OF MANUFACTURING ORGANIC LIGHT-EMITTING DIODE (OLED) DISPLAY

(71) Applicant: Samsung Display Co., Ltd., Yongin (KR)

(72) Inventors: Doohwan Kim, Yongin-si (KR); Okkeun Song, Hwaseong-si (KR); Il hwa Hong, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/133,291

(22) Filed: Dec. 18, 2013

(30) Foreign Application Priority Data

Jul. 9, 2013 (KR) ........................ 10-2013-0080450

(51) Int. Cl.
*H01L 21/00* (2006.01)
*H01L 51/56* (2006.01)

(52) U.S. Cl.
CPC ...................................... *H01L 51/56* (2013.01)
USPC ................................ 438/29; 438/99; 438/155

(58) Field of Classification Search
USPC .......................... 438/29, 46, 47, 151, 155, 99
See application file for complete search history.

(56) References Cited

U.S. PATENT DOCUMENTS 7,598,111 B2 * 10/2009 Im et al. .......................... 438/82
8,673,697 B2 * 3/2014 Kim et al. ..................... 438/151
2011/0220909 A1 * 9/2011 Stainer et al. ................... 257/72
2012/0161141 A1 6/2012 Jeon et al.
2013/0264564 A1 * 10/2013 Park et al. ....................... 257/43

FOREIGN PATENT DOCUMENTS

KR 10-0501707 B1 7/2005
KR 10-0825384 B1 4/2008
KR 10-0848342 B1 7/2008
KR 10-2012-0072949 A 7/2012
KR 10-2012-0072950 A 7/2012

* cited by examiner

*Primary Examiner* — Kevin M Picardat
(74) *Attorney, Agent, or Firm* — Knobbe, Martens, Olson & Bear, LLP

(57) ABSTRACT

A method of manufacturing an organic light-emitting diode (OLED) display is disclosed. In one aspect, the method includes forming a color filter on a thin film transistor substrate, forming an organic planarization layer on the color filter, and performing a vacuum heat-treatment on the color filter and organic planarization layer. The method also includes forming a first electrode on the organic planarization layer, forming an organic light-emitting layer on the first electrode, and forming a second electrode on the organic light-emitting layer. The vacuum heat-treatment is performed at a temperature in the range of about 150° C. to about 300° C. under a pressure substantially equal to or lower than about $10^{-3}$ Torr before the organic light-emitting layer is formed.

19 Claims, 8 Drawing Sheets

METHOD OF MANUFACTURING ORGANIC LIGHT-EMITTING DIODE (OLED) DISPLAY

CROSS-REFERENCE TO RELATED APPLICATIONS

This U.S. non-provisional patent application claims priority under 35 U.S.C. §119 of Korean Patent Application No. 10-2013-0080450, filed on Jul. 9, 2013, the contents of which are hereby incorporated by reference in its entirety.

BACKGROUND

1. Field

The described technology generally relates to a method of manufacturing an organic light-emitting diode (OLED) display.

2. Description of the Related Technology

In recent years, as the demand for portable displays continues to increase, flat panel displays have been researched, developed and commercialized due to their distinguishing technical characteristics such as being relatively lightweight and thin.

In general, OLED displays possess particularly desirable characteristics since they are self-emissive and do not require a separate light source. Accordingly, OLED displays generally have the advantages of being relatively thin and lightweight. In addition, OLED displays generally have other desirable properties, e.g., fast response speeds, low driving voltage, high contrast, etc.

Generally, the manufacturing process of OLED displays is relatively simple when compared to that of liquid crystal displays (LCDs) or plasma displays. In addition, when an OLED display is driven by an active matrix mechanism in which a thin film transistor is disposed in each pixel as a switching device, the display typically provides the same brightness as other displays even though the OLED display is driven with comparatively low voltage.

SUMMARY OF CERTAIN INVENTIVE ASPECTS

One inventive aspect is an organic OLED display, which is capable of improving the display quality thereof.

Another aspect is a method of manufacturing an OLED display including forming a color filter on a thin film transistor substrate and forming an organic planarization layer on the color filter. Then, a vacuum heat-treatment is performed on the color filter and organic planarization layer, a first electrode is formed on the organic planarization layer, and an organic light-emitting member is formed on the first electrode. After that, a second electrode is formed on the organic light-emitting member.

The vacuum heat-treatment is performed at a temperature in the range of about 150° C. to about 300° C. under a pressure substantially equal to or lower than about $10^{-3}$ Torr before the organic light-emitting member is formed.

Another aspect is a method of manufacturing an OLED display including forming a color filter on a thin film transistor substrate, performing a vacuum heat-treatment on the color filter and forming a first electrode on the color filter to directly contact the color filter. Then, an organic light-emitting member is formed on the first electrode and a second electrode is formed on the organic light-emitting member.

The vacuum heat-treatment is performed at a temperature in the range of about 150° C. to about 300° C. under a pressure substantially equal to or lower than about $10^{-3}$ Torr before the organic light-emitting member is formed.

According to at least one embodiment, the vacuum heat-treatment is performed on the color filter and the organic planarization layer or on the color filter. Thus, a pixel may be prevented from being reduced in size due to gas generated when the color filter and the organic planarization layer are formed.

BRIEF DESCRIPTION OF THE DRAWINGS

The above and other advantages of the described technology will become readily apparent with reference to the following detailed description when considered in conjunction with the accompanying drawings.

DETAILED DESCRIPTION OF CERTAIN INVENTIVE EMBODIMENTS

Figure 1:
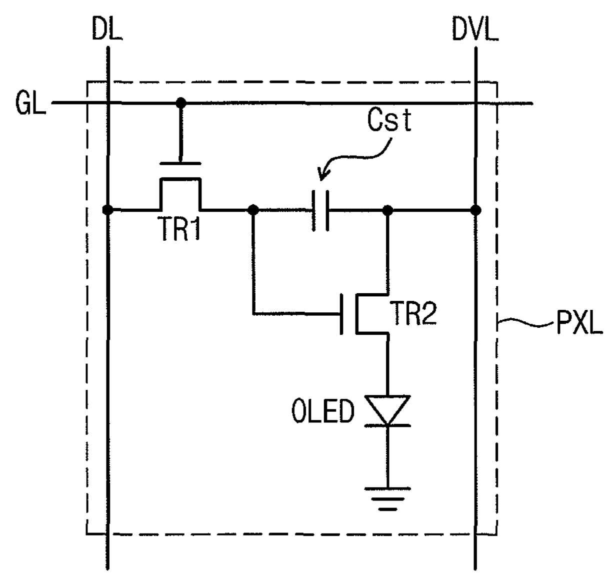
FIG. 1 is a circuit diagram showing an OLED display according to an exemplary embodiment.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the described technology.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the described technology. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the described technology belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the described technology will be explained in detail with reference to the accompanying drawings.

Prior to describing a method of manufacturing an OLED display, the OLED display will be described. In the following description, the direction from a substrate SUB to an encapsulation substrate ENP will be referred to as an upper direction and the direction from the encapsulation substrate ENP to the substrate SUB will be referred to as a lower direction.

Figure 2:
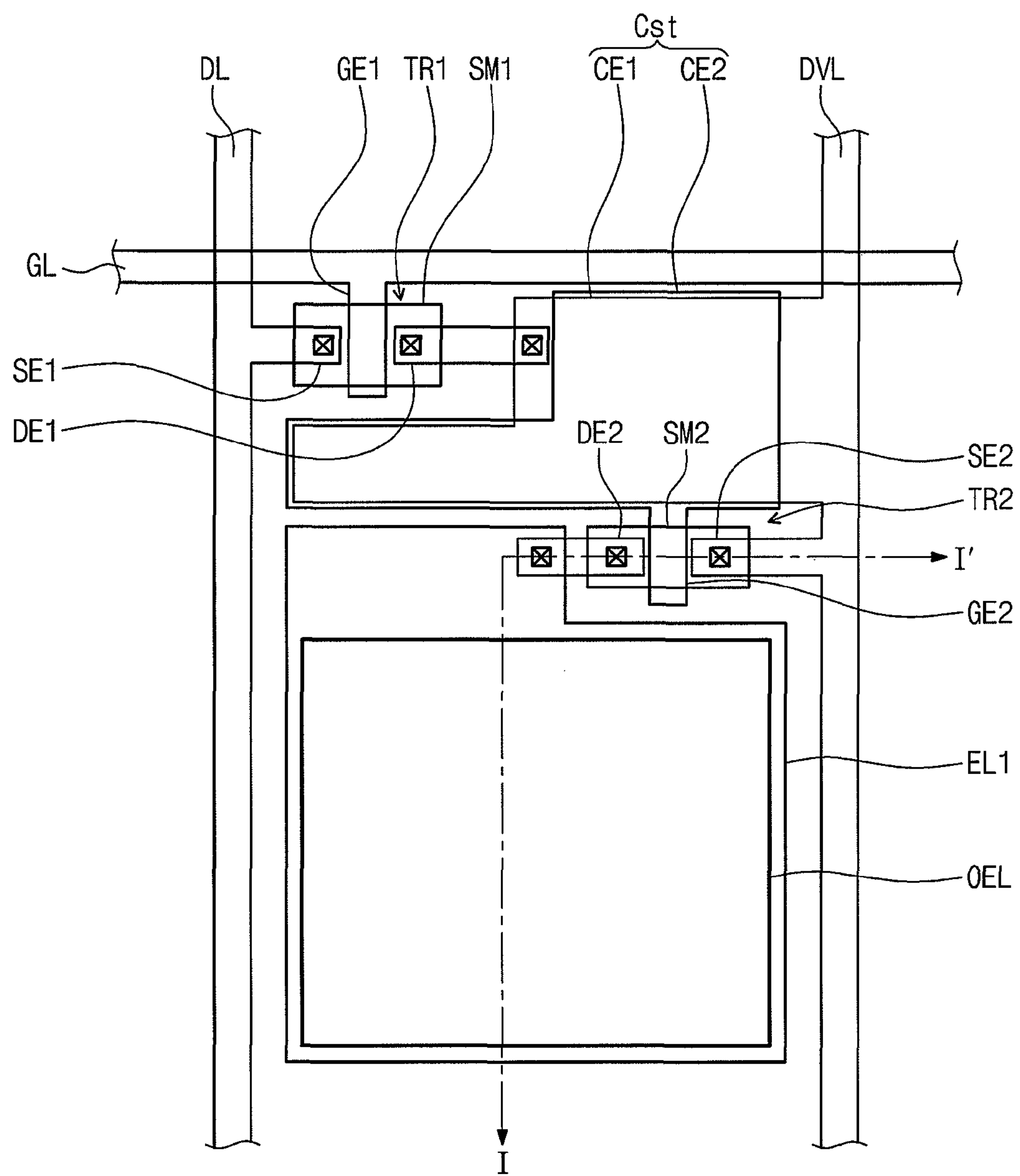
FIG. 2 is a plan view showing the sub-pixel shown in FIG. 1.
Figure 3:
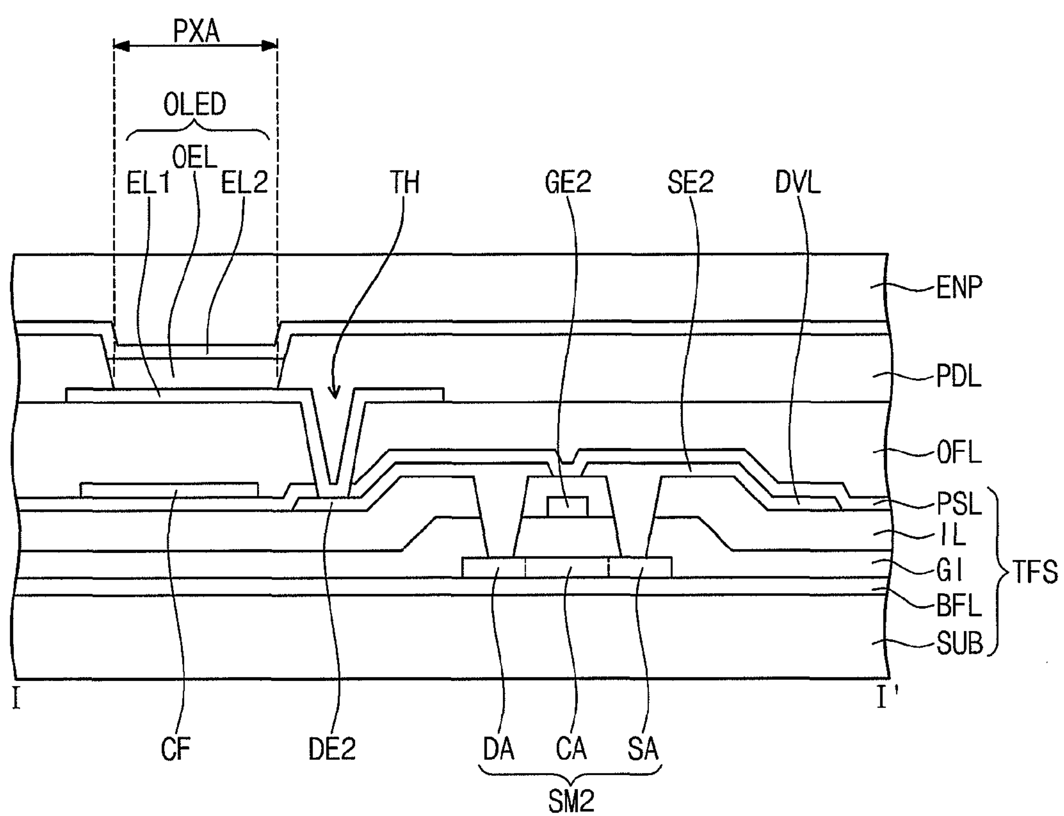
FIG. 3 is a cross-sectional view taken along line I-I' of FIG. 2.

FIG. 1 is a circuit diagram showing a sub-pixel of an OLED display according to an exemplary embodiment, FIG. 2 is a plan view showing the sub-pixel shown in FIG. 1, and FIG. 3 is a cross-sectional view taken along the line I-I' shown in FIG. 2.

Referring to FIGS. 1 to 3, the OLED display includes at least one main pixel (not shown) on which an image is displayed. The main pixel includes two or more sub-pixels PXL that display different colors. The different colors displayed by the sub-pixels PXL are mixed with each other to form the image displayed on the main pixel.

A plurality of main pixels are provided, and the main pixels are arranged in a substantially matrix form. The sub-pixels PXL are arranged in a line in the main pixel. Each of the sub-pixels PXL is illustrated to have a substantially rectangular shape, but should not be limited to a rectangular shape. In addition, the sub-pixels PXL may have different areas. For instance, the area and shape of the sub-pixels PXL may be determined depending on the color of the light emitted from the sub-pixels PXL.

One sub-pixel PXL will be described as a representative example. The sub-pixel PXL includes a plurality of signal lines including a gate line GL, a data line DL, and a driving voltage line DVL, a plurality of thin film transistors connected to the signal lines, an OLED connected to the thin film transistors, and a capacitor Cst.

The gate line GL extends in one direction and the data line DL extends in a direction substantially perpendicular to the direction in which the gate line GL extends. The gate line GL crosses the data line DL, and the driving voltage line DVL extends in substantially the same direction as the data line DL.

The gate line GL applies a scan signal to the thin film transistors, the data line DL applies a data signal to the thin film transistors, and the driving voltage line DVL applies a driving voltage to the thin film transistors.

The thin film transistors include a driving thin film transistor TR2 to control the OLED and a switching thin film transistor TR1 to supply a data signal received from the data line DL to the driving thin film transistor TR2. In the present exemplary embodiment, the sub-pixel PXL is described as including two thin film transistors, but the number of the thin film transistors should not be limited to two. That is, one sub-pixel PXL may include three or more thin film transistors and two or more capacitors.

The switching thin film transistor TR1 includes a first gate electrode GE1, a first source electrode SE1, and a first drain electrode DE1. The first gate electrode GE1 is connected to the gate line GL and the first source electrode SE1 is connected to the data line DL. The first drain electrode DE1 is connected to a second gate electrode GE2 of the driving thin film transistor TR2. The switching thin film transistor TR1 supplies the data signal applied to the data line DL to the driving thin film transistor TR2 in response to the scan signal applied to the gate line GL.

The driving thin film transistor TR2 includes the second gate electrode GE2, a second source electrode SE2, and a second drain electrode DE2. The second gate electrode GE2 is connected to the switching thin film transistor TR1, the second source electrode SE2 is connected to the driving voltage line DVL, and the second drain electrode DE2 is connected to the OLED.

The OLED includes an organic light-emitting member (or an organic light-emitting layer) OEL, a first electrode EL1, and a second electrode EL2 facing the first electrode EL1 with the organic light-emitting member OEL interposed therebetween. The first electrode EL1 is connected to the second drain electrode DE2 of the driving thin film transistor TR2. The second electrode EL2 is applied with a common voltage and the organic light-emitting member OEL emits light in response to an output signal received from the driving thin film transistor TR2, thereby displaying an image.

The capacitor Cst is connected between the second gate electrode GE2 of the driving thin film transistor TR2 and the second source electrode SE2. The capacitor Cst is charged with the data signal received from the first drain electrode DE1 of the switching thin film transistor TR1.

The OLED display includes a thin film transistor (TFT) substrate TFS and the OLED. The TFT substrate TFS includes a substrate SUB, and first and second semiconductor layers SM1 and SM2, a gate insulating layer GI, the first and second gate electrodes GE1 and GE2, an inter-insulating layer IL, the first and second drain electrodes DE1 and DE2, the first and second source electrodes SE1 and SE2, and a passivation layer PSL, which are sequentially stacked on the substrate SUB.

A buffer layer BFL is disposed between the first semiconductor layer SM1 and the substrate SUB and between the second semiconductor layer SM2 and the substrate SUB. The buffer layer BFL prevents foreign substances from being diffused to the switching thin film transistor TR1 and the driving thin film transistor TR2. The buffer layer BFL may be formed of silicon nitride (SiNx), silicon oxide (SiOx), silicon nitride-oxide (SiOxNy) or may be omitted depending on the material used to form the substrate SUB and the design parameters of the OLED display.

The first and second semiconductor layers SM1 and SM2 are disposed on the buffer layer BFL. The first and second semiconductor layers SM1 and SM2 are formed of a semiconductor material. Each of the first and second semiconductor layers SM1 and SM2 includes a source area SA, a drain area DA, and a channel area CA disposed between the source area SA and the drain area DA.

Each of the first and second semiconductor layers SM1 and SM2 may include an inorganic or organic semiconductor. For instance, the first and second semiconductor layers SM1 and SM2 may include an oxide semiconductor, amorphous silicon semiconductor, crystalline or polycrystalline silicon semiconductor, etc. The oxide semiconductor may include an oxide material containing at least one of indium (In), gallium (Ga), zinc (Zn), or tin (Sn). For instance, the first and second semiconductor layers SM1 and SM2 may include an oxide semiconductor, e.g., zinc (Zn) oxide, tin (Sn) oxide, indium (In) oxide, indium-zinc (In—Zn) oxide, indium-tin (In—Sn) oxide, indium-gallium-zinc (In—Ga—Zn) oxide, indium-zinc-tin (In—Zn—Sn) oxide, indium-gallium-zinc-tin (In—Ga—Zn—Sn) oxide, etc. The source area SA and the drain area DA are doped with an n-type impurity or a p-type impurity.

The gate insulating layer GI is disposed on the first semiconductor layer SM1 and the second semiconductor layer SM2.

The first and second gate electrodes GE1 and GE2 are electrically connected to the gate line GL and are disposed on the gate insulating layer GI. The first gate electrode GE1 is substantially overlapped with the first semiconductor layer SM1 and the second gate electrode GE2 is substantially overlapped with the second semiconductor layer SM2.

The inter-insulating layer IL is disposed on the gate insulating layer GI to cover the first and second gate electrodes GE1 and GE2.

The first source electrode SE1, the first drain electrode DE1, the second source electrode SE2, and the drain electrode DE2 are disposed on the inter-insulating layer IL. The first source electrode SE1 and the first drain electrode DE1 are respectively electrically connected to the source area SA and the drain area DA of the first semiconductor layer SM1 through contact holes formed through the inter-insulating layer IL and the gate insulating layer GI. The second source electrode SE2 and the second drain electrode DE2 are respectively electrically connected to the source area SA and the drain area DA of the second semiconductor layer SM2 through contact holes formed through the inter-insulating layer IL and the gate insulating layer GI.

Additionally, a portion of the second gate electrode GE2 and a portion of the driving voltage line DVL serve as a first capacitor electrode CE1 and a second capacitor electrode CE2, respectively. The first and second capacitor electrodes CE1 and CE2 face each other and the inter-insulating layer IL is interposed therebetween to form the capacitor Cst.

The passivation layer PSL is disposed on the first source electrode SE1, the first drain electrode DE1, the second source electrode SE2, and the second drain electrode DE2. The passivation layer PSL prevents external foreign substances from being diffused to the channels of the switching thin film transistor TR1 and the driving thin film transistor TR2.

The passivation layer PSL may include an inorganic electrically insulating material. The passivation layer PSL may include silicon nitride (SiNx), silicon oxide (SiOx), or silicon nitride-oxide (SiOxNy). The passivation layer PSL may be omitted depending on the design parameters of the OLED display.

A color filter CF is disposed on the passivation layer PSL. The light generated by the organic light-emitting member OEL is filtered by the color filter to the desired color. One main pixel may include three sub-pixels PXL including red, green, and blue color filters CF to emit red, green, and blue light, respectively. In this case, the sub-pixels PXL including the red, green, and blue color filters CF respectively serve as a red, green, and blue sub-pixels.

The colors of the light filtered by the color filters CF should not be limited to red, green, and blue. That is, according to embodiments, the colors of the color filters may be yellow or magenta.

According to another embodiment, the main pixel may further include a white sub-pixel PXL that emits white light in addition to the red, green, and blue sub-pixels. In this case, the white sub-pixel does not need to include a color filter CF.

An organic planarization layer OFL is disposed on the color filter CF. The organic planarization layer OFL planarizes an upper surface of the substrate SUB.

The organic planarization layer OFL and the passivation layer PSL are provided with a thru-hole TH formed therethrough to expose a portion of an upper surface of the second drain electrode DE2.

The first electrode EL1 is disposed on the organic planarization layer OFL as an anode of the OLED. The first electrode EL1 is electrically connected to the second drain electrode DE2 of the driving thin film transistor TR2 through the thru-hole TH. Here, the first electrode EL1 may be used as a cathode, but the first electrode EL1 will be described as an anode in the present exemplary embodiment.

A pixel defining layer PDL is disposed on the substrate SUB on which the first electrode EL1 is disposed to partition sub-pixel areas PXA respectively corresponding to the sub-pixels PXL. The pixel defining layer PDL exposes the upper surface of the first electrode ED and is protruded from the substrate SUB around the sub-pixel areas PXA of each sub-pixel PXL.

The organic light-emitting member OEL is disposed in the sub-pixel area PXA surrounded by the pixel defining layer PDL and the second electrode EL2 is disposed on the organic light-emitting member OEL. In the present exemplary embodiment, the organic light-emitting member OEL emits white light.

The organic light-emitting member OEL includes a light-emitting layer and other layers having different functions. For instance, the organic light-emitting member OEL may include a hole injection layer, a hole transport layer, an organic light-emitting layer, an electron transport layer, and an electron injection layer, which are sequentially stacked on the first electrode EL1. In addition, at least one of the hole injection layer, the hole transport layer, the electron transport layer, and the electron injection layer may be omitted.

An encapsulation substrate ENP is disposed on the second electrode EL2 to cover the second electrode EL2.

Hereinafter, a method of manufacturing the OLED display will be described with reference to FIGS. 1 to 5. For the convenience of explanation, the description of certain elements of the OLED display, e.g., the TFT substrate, will be omitted. In FIG. 5, the same reference numerals denote the same elements in FIGS. 1 to 3, and thus detailed descriptions of the same elements will be omitted.

Figure 4:
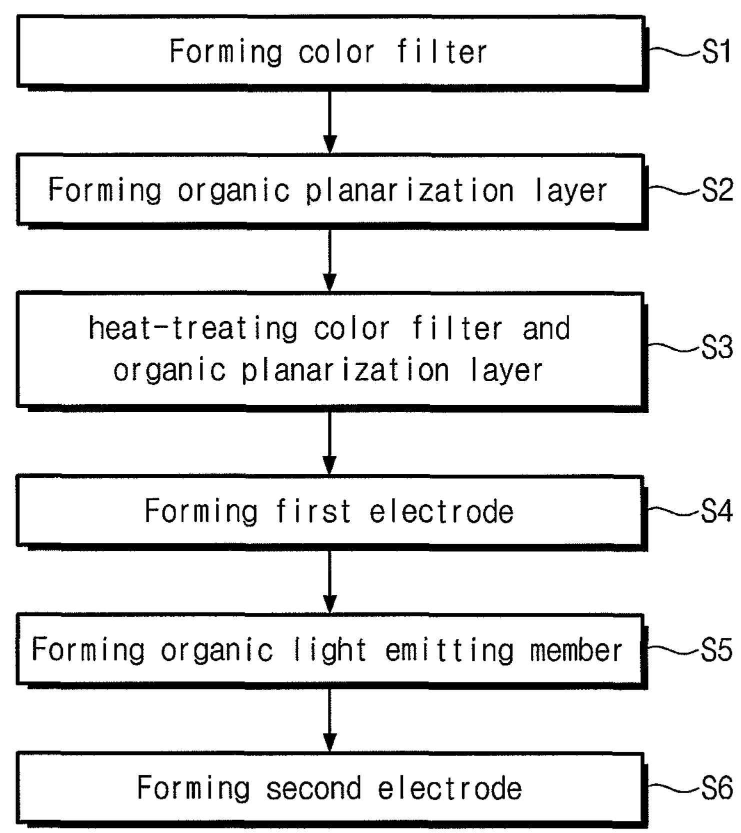
FIG. 4 is a flowchart showing a method of manufacturing an OLED display according to an exemplary embodiment.
Figure 5:
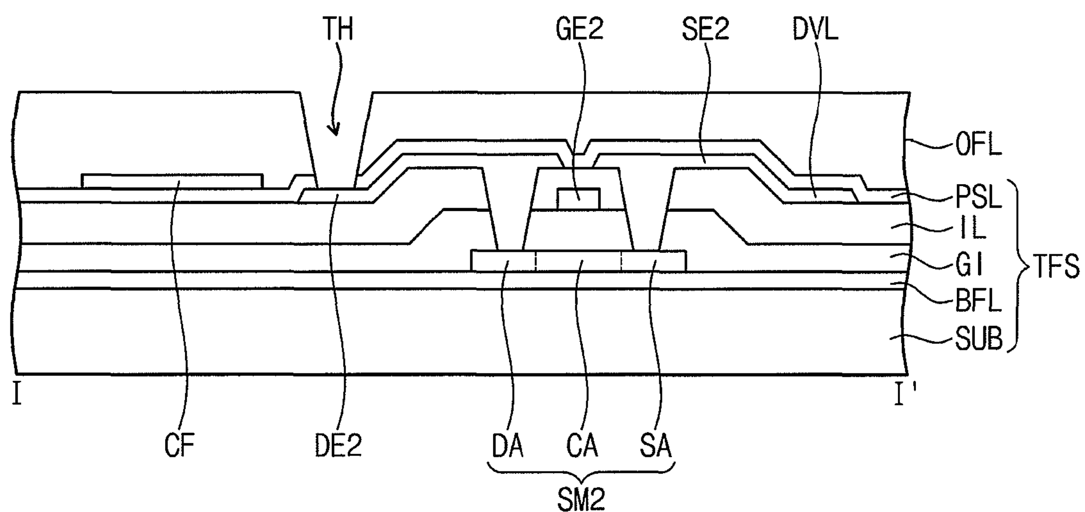
FIG. 5 is a cross-sectional view showing a portion of the manufacturing method of the OLED display according to an exemplary embodiment

FIG. 4 is a flowchart showing a method of manufacturing the OLED display according to an exemplary embodiment and FIG. 5 is a cross-sectional view showing a portion of the manufacturing method according to an exemplary embodiment.

Referring to FIG. 4, the manufacturing method of the OLED display includes forming the color filter (S1), forming the organic planarization layer (S2), vacuum heat-treating the color filter and the organic planarization layer at a temperature in the range of about 150° C. to about 300° C. in a vacuum chamber maintained at a pressure substantially equal to or lower than about $10^{-3}$ Torr (S3), forming the first electrode (S4), forming the organic light-emitting member (S5), and forming the second electrode (S6).

Referring to FIG. 5, the color filter CF is formed on the TFT substrate TFS (S1). The color filter CF may be formed by using dye, pigment, and photosensitive material. In addition, the color filter CF has a glass transition temperature (Tg) less than about 300° C. According to some embodiments, the glass transition temperature (Tg) of the color filter may be substantially equal to or greater that about 300° C.

In the present exemplary embodiment, the color filter CF is formed on the TFT substrate TFS using a photolithography process. According to another embodiment, the color filter CF may be formed by a deposition process with a fine metal mask, or the color filter CF may be formed by a laser printing process or a printing process.

Then, the organic planarization layer OFL is formed on the color filter CF (S2). The organic planarization layer OFL is formed of an electrically insulating material that is able to be planarized. For instance, the organic planarization layer OFL may be formed of at least one material selected from the group consisting of polyacrylates resin, epoxy resin, phenolic resin, polyamides resin, polyimides resin, unsaturated polyesters resin, poly(phenylenethers) resin, poly(phenylenesulfides) resin, polyvinyl alcohol, parylene, or benzocyclobutene (BCB).

The organic planarization layer OFL has a glass transition temperature (Tg) less than about 300° C. According to some embodiments, the glass transition temperature (Tg) of the organic planarization layer OFL may be substantially equal to or greater than about 300° C.

Next, the color filter CF and the organic planarization layer OFL are vacuum heat-treated (S3).

The vacuum heat-treatment is performed on the color filter CF and the organic planarization layer OFL at a temperature from about 150° C. to about 300° C. in a vacuum chamber maintained at a pressure substantially equal to or lower than about $10^{-3}$ Torr. In more detail, the pressure required to perform the vacuum heat-treatment is in the range from about $10^{-7}$ Torr to about $10^{-3}$ Torr. In addition, the vacuum heat-treatment is performed for a time of about 10 minutes to about 2 hours, for example, for a time of about 30 minutes to about 1 hour.

When the pressure of the vacuum chamber is less than about $10^{-3}$ Torr, intensity of the vacuum in the vacuum chamber increases. As the intensity of the vacuum in the vacuum chamber increases, the time required to perform the vacuum heat-treatment process becomes shorter. Thus, as long as the color filter CF and the organic planarization layer OFL are not damaged, the design parameters of the vacuum heat-treatment process may be set based at least in part on the pressure, temperature, and time duration such that gas produced in the color filter CF and the organic planarization layer OFL is sufficiently discharged. In this case, the temperature of the vacuum heat-treatment may be lower than the glass transition temperature Tg of the color filter CF and the organic planarization layer OFL.

Since the color filter CF and the organic planarization layer OFL include organic materials, the organic materials are depolymerized during the manufacturing process of the OLED display, and thus the organic materials are discharged in a gas form. When the vacuum heat-treatment process is performed during the time in which the gas is discharged, the gas may be sufficiently discharged from the color filter CF and the organic planarization layer OFL. Accordingly, after the vacuum heat-treatment process is performed on the color filter CF and the organic planarization layer OFL, the gas may be substantially prevented from being discharged from the color filter CF and the organic planarization layer OFL. As a result, the organic light-emitting member OEL of the OLED may be prevented from being reduced in size by the gas.

Then, the first electrode EL1 is disposed on the organic planarization layer OFL, which has been vacuum heat-treated, to directly contact the organic planarization layer OFL (S4).

The first electrode EL1 serves as the anode, but it should not be limited thereto.

The first electrode EL1 may include a material having a high work function. In addition, since the light generated by the organic light-emitting member OEL is emitted to the environment through the color filter CF and the TFT substrate TFS, the first electrode EL1 may be a transparent conductive layer, e.g., indium tin oxide (ITO), indium zinc oxide (IZO), zinc oxide (ZO), or indium tin zinc oxide (ITZO).

Thus, after the vacuum heat-treatment process is finished, the gas discharged from the color filter CF and the organic planarization layer OFL is blocked by the first electrode EL1.

As described above, the vacuum heat-treatment process is performed after forming the color filter CF and the organic planarization layer OFL and before forming the first electrode EL1. However, since the outer shape and electrical properties of the first electrode EL1 are not influenced by the vacuum heat-treatment process, the vacuum heat-treatment process may be performed after the color filter CF, the organic planarization layer OFL, and the first electrode EL1 are formed.

The organic light-emitting member OEL is formed on the first electrode EL1 (S5). The organic light-emitting member OEL may be an organic layer.

The second electrode EL2 is formed on the organic light-emitting member OEL (S6). When the first electrode EL1 serves as the anode, the second electrode EL2 serves as the cathode.

In this case, the second electrode EL2 may include a material with a low work function, e.g., a metal alloy, electric conductive compound, or mixtures thereof, or more particularly, lithium (Li), magnesium (Mg), aluminum (Al), aluminum-lithium (Al—Li), calcium (Ca), magnesium-indium (Mg—In), magnesium-silver (Mg—Ag), etc.

The encapsulation substrate ENP is formed on the second electrode EL2. The encapsulation substrate ENP is coupled to the substrate SUB on which the second electrode EL2 is formed. The encapsulation substrate ENP includes a transparent electrically insulating material, e.g., plastic or glass, and further includes an absorbing member which is water resistant.

When the OLED display is manufactured by the above-mentioned method, the sub-pixels may be prevented from being reduced in size even though the gas is discharged from the color filter CF and the organic planarization layer OFL.

Alternatively, if a vacuum heat-treatment is not performed, due to the heat applied to the color filter CF and the organic planarization layer OFL while the color filter CF and the organic planarization layer OFL are formed, gas may be discharged from the color filter CF and the organic planarization layer OFL. Thus, the gas may be discharged into the sub-pixel PXL, reducing the size of the organic light-emitting member OEL, i.e., pixel shrinkage.

As described above, since the vacuum heat-treatment process is performed on the color filter CF and the organic planarization layer OFL before the organic light-emitting member OEL is formed, the gas may be sufficiently discharged from the color filter CF and the organic planarization layer OFL before the organic light-emitting member OEL is formed. Therefore, the organic light-emitting member OEL may be prevented from being reduced in size.

Figure 6:
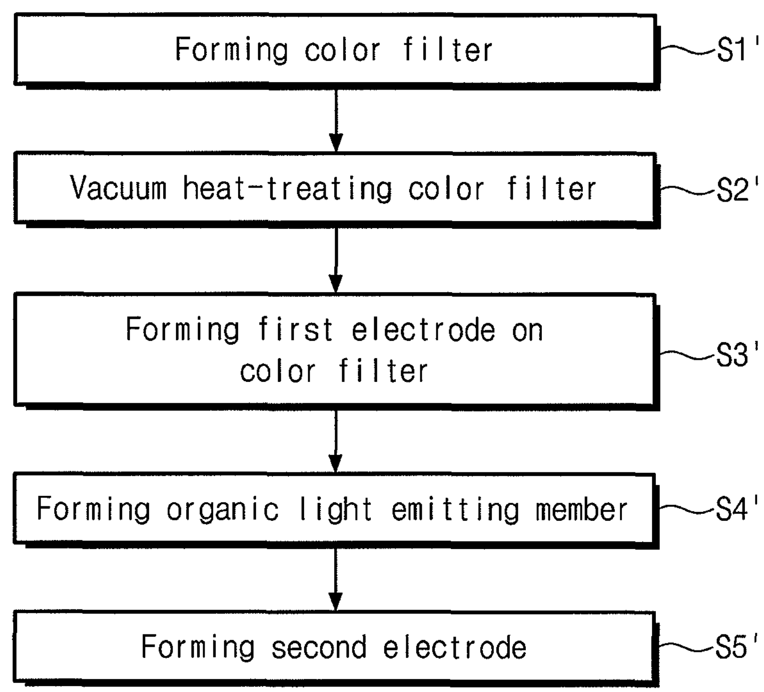
FIG. 6 is a flowchart showing a method of manufacturing an OLED display according to another exemplary embodiment.
Figure 7:
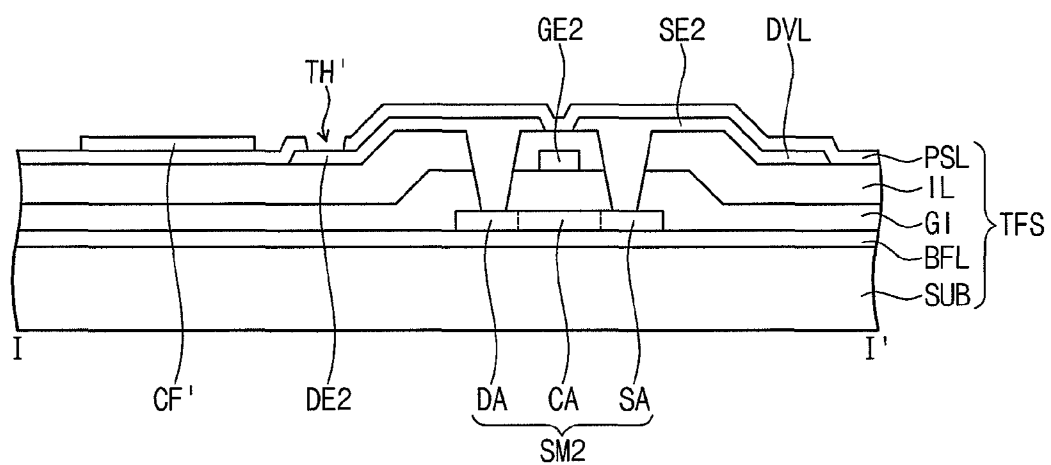
FIG. 7 is a cross-sectional view showing a portion of the manufacturing method of the OLED display according to another exemplary embodiment
Figure 8:
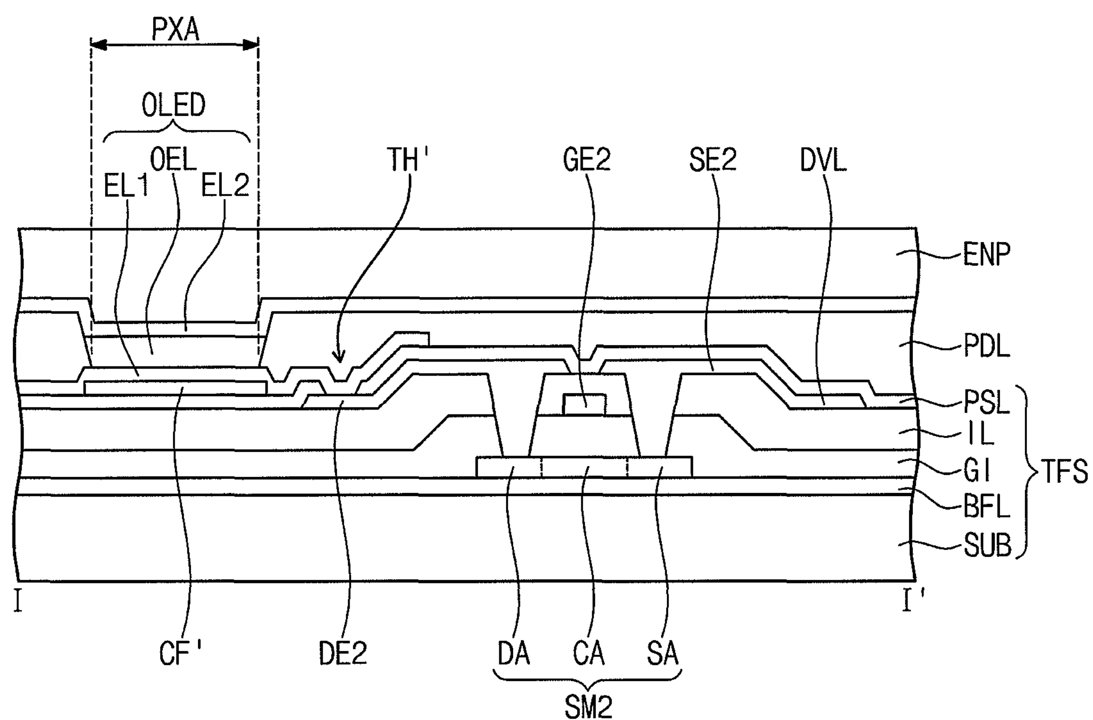
FIG. 8 is a cross-sectional view showing an OLED display according to another exemplary embodiment.

Hereinafter, a manufacturing method of an OLED display according to another exemplary embodiment of the present disclosure will be described in detail with reference to FIGS. 6 to 8. In FIGS. 6 to 8, the same reference numerals denote the same elements in FIGS. 1 to 5, and thus detailed descriptions of the same elements will be omitted.

FIG. 6 is a flowchart showing the manufacturing method of the OLED display according to another exemplary embodiment, FIG. 7 is a cross-sectional view showing a portion of the manufacturing method of the OLED display according to another exemplary embodiment, and FIG. 8 is a cross-sectional view showing an OLED display according to another exemplary embodiment.

Referring to FIG. 6, the manufacturing method of the OLED display includes forming a color filter (S1'), vacuum heat-treating the color filter at a temperature in the range of about 150° C. to about 300° C. in a vacuum chamber maintained at a pressure substantially equal to or lower than about $10^{-3}$ Torr (S2'), forming a first electrode to directly contact the color filter (S3'), forming an organic light-emitting member (S4'), and forming a second electrode (S5').

Referring to FIG. 7, the color filter CF' is formed on the TFT substrate TFS (S1').

The color filter CF' may include dye, pigment, acrylic resin, dispersant, or photosensitive material and be formed by a photolithography process. In addition, the color filter CF' may have a glass transition temperature (Tg) less than about 300° C. According to some embodiments, the glass transition temperature (Tg) of the color filter may be substantially equal to or greater than about 300° C.

The vacuum heat-treatment process is performed on the color filter CF' at a temperature from about 150° C. to about 300° C. in the vacuum chamber maintained at a pressure substantially equal to or lower than about $10^{-3}$ Torr, for example, at a pressure from about $10^{-7}$ Torr to about $10^{-3}$ Torr (S2').

When the pressure of the vacuum chamber is less than about $10^{-3}$ Torr, the intensity of the vacuum in the vacuum chamber increases. As the intensity of the vacuum in the vacuum chamber increases, the time required to perform the vacuum heat-treatment process becomes shorter. Thus, as long as the color filter CF and the organic planarization layer OFL are not damaged, the design parameters of the vacuum heat-treatment process may be set based at least in part on the pressure, temperature, and time duration such that gas produced in the color filter CF and the organic planarization layer OFL is sufficiently discharged. In this case, the temperature of the vacuum heat-treatment may be lower than the glass transition temperature Tg of the color filter CF and the organic planarization layer OFL.

When the vacuum heat-treatment process is performed on the color filter CF', the gas is sufficiently discharged from the color filter CF'.

Referring to FIG. 8, the first electrode EL1 is formed on the color filter CF' to directly contact the color filter CF' (S3'). That is, according to the present exemplary embodiment, the process of forming the organic planarization layer OFL (refer to FIG. 5) is omitted, and thus the first electrode EL1 is formed after the color filter CF is formed.

The organic light-emitting member OEL is formed on the first electrode EL1 (S4') and the second electrode EL2 is formed on the organic light-emitting member OEL (S5').

The vacuum heat-treatment process is performed after the color filter CF is formed and before the first electrode EL1 is formed. However, since the outer shape and electrical properties of the first electrode EL1 are not influenced by the vacuum heat-treatment process, the vacuum heat-treatment process may be performed after the color filter CF and the first electrode EL1 are formed.

As described above, the vacuum heat-treatment process is performed on the color filter CF before the organic light-emitting member OEL is formed, and thus the gas may be sufficiently discharged from the color filter CF before the organic light-emitting member OEL is formed. Therefore, the organic light-emitting member OEL may be prevented from being reduced in size.

Although exemplary embodiments of the described technology have been described, it is understood that the invention should not be limited to these exemplary embodiments but various changes and modifications can be made by one ordinary skilled in the art within the spirit and scope of the described technology as defined by the accompanying claims.

What is claimed is:

1. A method of manufacturing an organic light-emitting diode (OLED) display, comprising:

providing a thin film transistor substrate;

forming a color filter over the thin film transistor substrate;

forming an organic planarization layer over the color filter;

performing a vacuum heat-treatment on the color filter and the organic planarization layer;

forming a first electrode over the organic planarization layer;

forming an organic light-emitting layer over the first electrode; and forming a second electrode over the organic light-emitting layer, wherein the vacuum heat-treatment is performed at a temperature in the range of about 150° C. to about 300° C. under a pressure substantially equal to or lower than about $10^{-3}$ Torr before the organic light-emitting layer is formed.

2. The method of claim 1, wherein the vacuum heat-treatment is performed in a vacuum chamber.

3. The method of claim 1, wherein the vacuum heat-treatment is performed for a period of about 10 minutes to about 2 hours.

4. The method of claim 1, wherein the vacuum heat-treatment is performed for a period of about 30 minutes to about 1 hour.

5. The method of claim 1, wherein the first electrode directly contacts the organic planarization layer.

6. The method of claim 1, wherein the thin film transistor substrate comprises a plurality of main pixels, and wherein each of the main pixels comprises a plurality of sub-pixels configured to display different colors.

7. The method of claim 6, wherein the color filter comprises a plurality of color filters each formed in the sub-pixels and wherein the color filters have different colors from each other.

8. The method of claim 1, wherein the organic light-emitting layer is configured to emit light through the color filter.

9. The method of claim 1, wherein the vacuum heat-treatment is performed before the first electrode is formed.

10. The method of claim 1, wherein the vacuum heat-treatment is performed after the first electrode is formed.

11. A method of manufacturing an organic light-emitting diode (OLED) display, comprising:

providing a thin film transistor substrate;

forming a color filter over the thin film transistor substrate;

performing a vacuum heat-treatment on the color filter;

forming a first electrode over the color filter, wherein the first electrode directly contacts the color filter;

forming an organic light-emitting layer over the first electrode; and forming a second electrode over the organic light-emitting layer, wherein the vacuum heat-treatment is performed at a temperature in the range of about 150° C. to about 300° C. under a pressure substantially equal to or lower than about $10^{-3}$ Torr before the organic light-emitting layer is formed.

12. The method of claim 11, wherein the vacuum heat-treatment is performed in a vacuum chamber.

13. The method of claim 11, wherein the vacuum heat-treatment is performed for a period of about 10 minutes to about 2 hours.

14. The method of claim 11, wherein the vacuum heat-treatment is performed for a period of about 30 minutes to about 1 hour.

15. The method of claim 11, wherein the thin film transistor substrate comprises a plurality of main pixels, and wherein each of the main pixels comprises a plurality of sub-pixels configured to display different colors.

16. The method of claim 15, wherein the color filter comprises a plurality of color filters each formed in the sub-pixels and wherein the color filters have different colors from each other.

17. The method of claim 11, wherein the organic light-emitting layer is configured to emit light through the color filter.

18. The method of claim 11, wherein the vacuum heat-treatment is performed before the first electrode is formed.

19. The method of claim 11, wherein the vacuum heat-treatment is performed after the first electrode is formed.

* * * * *